United States Patent
Takahashi et al.

(10) Patent No.: US 6,713,885 B2
(45) Date of Patent: Mar. 30, 2004

(54) POWER SUPPLY, A SEMICONDUCTOR MAKING APPARATUS AND A SEMICONDUCTOR WAFER FABRICATING METHOD USING THE SAME

(75) Inventors: Youji Takahashi, Kudamatsu (JP); Tsutomu Iida, Kudamatsu (JP); Tsuyoshi Umemoto, Yamato (JP); Makoto Kashibe, Tokuyama (JP)

(73) Assignee: Hitachi High-Technologies Corporation, Tokyo (JP)

(*) Notice: Subject to any disclaimer, the term of this patent is extended or adjusted under 35 U.S.C. 154(b) by 90 days.

(21) Appl. No.: 10/082,160

(22) Filed: Feb. 26, 2002

(65) Prior Publication Data
US 2003/0162309 A1 Aug. 28, 2003

(51) Int. Cl.⁷ .............................................. H01L 23/58
(52) U.S. Cl. ..................... 257/798; 438/707; 438/709
(58) Field of Search ........................... 257/798; 438/14, 438/707, 709

(56) References Cited

U.S. PATENT DOCUMENTS 6,597,929 B1 * 7/2003 Han et al. ................... 455/574

FOREIGN PATENT DOCUMENTS

| JP | 5121468 | 5/1993 |
|---|---|---|
| JP | 6104248 | 4/1994 |
| JP | 2001004676 | 1/2001 |
| JP | 2001035345 | 2/2001 |

* cited by examiner

Primary Examiner—Hoai Ho
Assistant Examiner—Thao P. Le
(74) Attorney, Agent, or Firm—Antonelli, Terry, Stout & Kraus, LLP

(57) ABSTRACT

In power supply and a semiconductor making apparatus and a semiconductor fabricating method using the same, an abnormality can be detected when an offset occurs in a part constituting a closed-loop system of high-frequency power supply or dc power supply for a semiconductor making apparatus. Power supply for receiving a power value setting signal to set strength of power and a power on/off instruction to set on or off of outputting of the power interrupts the supply of the power even in a state in which a subsequent power on/off instruction is on if a power sense signal according to a value obtained by sensing the power exceeds a predetermined value when the power on/off instruction is off.

8 Claims, 6 Drawing Sheets

POWER SUPPLY, A SEMICONDUCTOR MAKING APPARATUS AND A SEMICONDUCTOR WAFER FABRICATING METHOD USING THE SAME

BACKGROUND OF THE INVENTION

The present invention relates to power supply, and in particular, to power supply to process a semiconductor wafer and a semiconductor making apparatus and a semiconductor fabricating method using the same.

Etching systems using plasma have been used in various fields and include an electron cyclotron resonance (ECR) etching system. In the ECR etching system, by applying a direct current (dc) flows to a coil disposed on an outer surface of a vacuum chamber or container, a magnetic field is generated, and a high voltage is applied to a magnetron to start oscillation. This introduces a microwave into the vacuum chamber to resultantly generate plasma therein. Ions incident to a sample are accelerated by applying a bias voltage of an alternating current (ac) to a sample stage. To electrostatically adsorb the sample, a dc bias voltage is also applied to the sample stage.

Power supply to produce a direct current to generate a magnetic field, power supply to produce a dc voltage to generate a microwave or to supply a dc bias voltage, and power supply to produce ac power for an ac bias voltage have been used as described above.

SUMMARY OF THE INVENTION

FIG. 6 shows high-frequency power supply for a semiconductor making apparatus of the prior art in a block diagram. In FIG. 6, high-frequency power supply produces high-frequency power to apply an ac bias voltage to a sample stage as a load to accelerate ions incident to a sample on the sample stage. A power directional coupler 41 senses strength of the power to output a power sense signal according to the strength. A controller 42 calculates a power amplification factor according to a difference between a power setting value as a preset value of strength of power outputted from a control microcomputer 1 of the semiconductor making apparatus to the high-frequency power supply 4 and a power sense value fed from the power directional coupler 41. A fixed oscillator circuit 43 outputs a fundamental wave fixed to a predetermined frequency of the high-frequency power supply 4. An amplifier 44 amplifies, according to the power amplification factor from the controller 42, the fundamental wave outputted from the oscillator circuit 43 to output a desired high-frequency power. The control microcomputer 1 of the semiconductor making apparatus outputs the power setting value to the high-frequency power supply 4 and also monitors the power sense value.

FIG. 7 shows dc power supply for a semiconductor making apparatus of the prior art in a block diagram. In FIG. 7, dc power supply 5 applies a dc current to a coil as a load to generate a desired magnetic field. A current sensor 51 senses strength of the dc current to output a dc sense signal according to the strength. A controller 52 outputs, according to a difference between a current setting value outputted from the control microcomputer 1 of the semiconductor making apparatus and the current sense value fed from the current sensor 51, a duty ratio of a switching unit 53, namely, a ratio of an on time of the switching unit 53 to one period of operation. A voltage transformer 54 including a primary side connected to a switching device 53 and a dc voltage supply 55 to supply a predetermined dc voltage to the primary side. The switching device 53 turns on and off according to the duty ratio from the controller 52 to chop the dc voltage. The chopped dc voltage is transformed to be outputted from a secondary side of the voltage transformer 54. A smoothing device 56 smoothes the output voltage from the secondary side of the transformer 54 into a dc voltage such that the dc power supply 5 resultantly outputs a desired direct current. The control microcomputer 1 of the semiconductor making apparatus outputs the power setting value to the dc power supply 5 and also monitors the current sense value. Description has been given of dc power supply to output a dc current. This similarly applies to dc power supply which receives a voltage setting value from the control microcomputer 1 to output a dc current. For example, the dc power supply is used to apply a dc voltage bias to a sample stage for the electrostatic adsorption the wafer. In this case, a voltage sensor which senses strength of the output voltage to output a voltage sense signal according to the strength is used in place of the current sensor 51.

In general, in a part of a control block such as the controller 42, the amplifier, or the power directional coupler 41 of FIG. 6 constituting a closed-loop control system such as the high-frequency power supply and the dc power supply described above, when an offset appears in an input to output relationship due to aging of analog parts and/or a latch-up phenomenon of digital parts of the control block, an unexpected change or shift also occurs in its control variable according to the offset. This is because the offset of the input to output relationship in the part of a control block of the closed-loop control system reflects in the power sense value of FIG. 6 such that the controller 42 sets the power amplifier degree to equalize the power sense value to the power setting value. For example, when the power amplifier degree to equalize the power sense value to the power setting value, actual power differs from the power setting value by the offset. Even if the control microcomputer 1 is monitoring to determine whether or not the power sense value is within a predetermined allowed range of the power setting value, since the power sense value is already equal to the power setting value, the control microcomputer 1 cannot detect occurrence of the abnormal offset and hence determines that the situation is normal. This also applies to the dc power supply of FIG. 7. Assume, for example, that an unexpected offset occurs in the input to output relationship of the current sensor 51. For example, when the current sense value is equal to the current setting value by controlling the duty ratio, actual power differs from the target value by the offset. However, the control microcomputer 1 cannot detect occurrence of the abnormal offset and hence determines that the situation is normal.

As a result, although the operation is achieved according to the predetermined setting value, the system cannot detect any fault during the semiconductor wafer fabrication. Until a defect of a semiconductor wafer thus processed is detected in a process downstream the fabrication process, the semiconductor wafers with the defect are continuously fabricated in each lot unit including, for example, 25 semiconductor wafers. This possibly leads to loss of a large amount of money. The diameter of the semiconductor wafer and the value added to the semiconductor wafer are increasing today. Therefore, potential of the loss due to defects in lot unit is increasing. In the field of semiconductor making apparatuses, a need exists for higher precision of the output power from these power supplies. This reduces the allowed range of only explicit abnormalities of constituent components but also a fine offset value due to gradual aging or the like. It is therefore important to detect occurrence of a fine offset to prevent defects.

It is therefore an object of the present invention, which has been devised to remove the problems, to provide power supply and a semiconductor making apparatus and a semiconductor wafer fabricating method using the same capable of detecting an abnormal offset due to an abnormality and abnormal aging of parts of power supply, particularly, high-frequency power supply and dc power supply employed in a semiconductor making apparatus.

To achieve the object, the present invention uses devices and steps as below.

According to the present invention, there is provided power supply for receiving a power value setting signal setting strength of power from said power supply and a power on/off instruction to set on or off of the power to produce the power, wherein if a power sense signal according to a value obtained by sensing the strength of the power exceeds a predetermined value when said power on/off instruction is off, the power is suppressed even if the power on/off instruction is subsequently set to on.

Alternatively, there is provided according to the present invention a semiconductor making apparatus comprising a processing chamber for processing a semiconductor wafer, power supply for outputting a current, a voltage, or power necessary for the semiconductor wafer processing, a control microcomputer for setting strength of the power to said power supply and for setting the outputting of the output item to on or off, and output sensing means for sensing the output item and for outputting an output sense signal according to a value obtained by sensing the output item, wherein if the output sense signal exceeds a predetermined threshold value when the outputting of the output item is off, the processing is stopped for a subsequent semiconductor wafer to be processed.

Moreover, there is provided according to the present invention a semiconductor wafer fabricating method comprising the steps of setting, to power supply for supplying a current, a voltage, or power necessary for processing of a semiconductor wafer, strength of the output; setting outputting of the output item to on or off; sensing the output item and for outputting an output sense signal according to a value obtained by sensing the output item; and stopping the processing for a subsequent semiconductor wafer to be processed if the output sense signal exceeds a predetermined threshold value when the outputting of the output item is off in said step of setting the outputting of the output item to on or off.

Other objects, features and advantages of the invention will become apparent from the following description of the embodiments of the invention taken in conjunction with the accompanying drawings.

DESCRIPTION OF THE EMBODIMENTS

Figure 1:
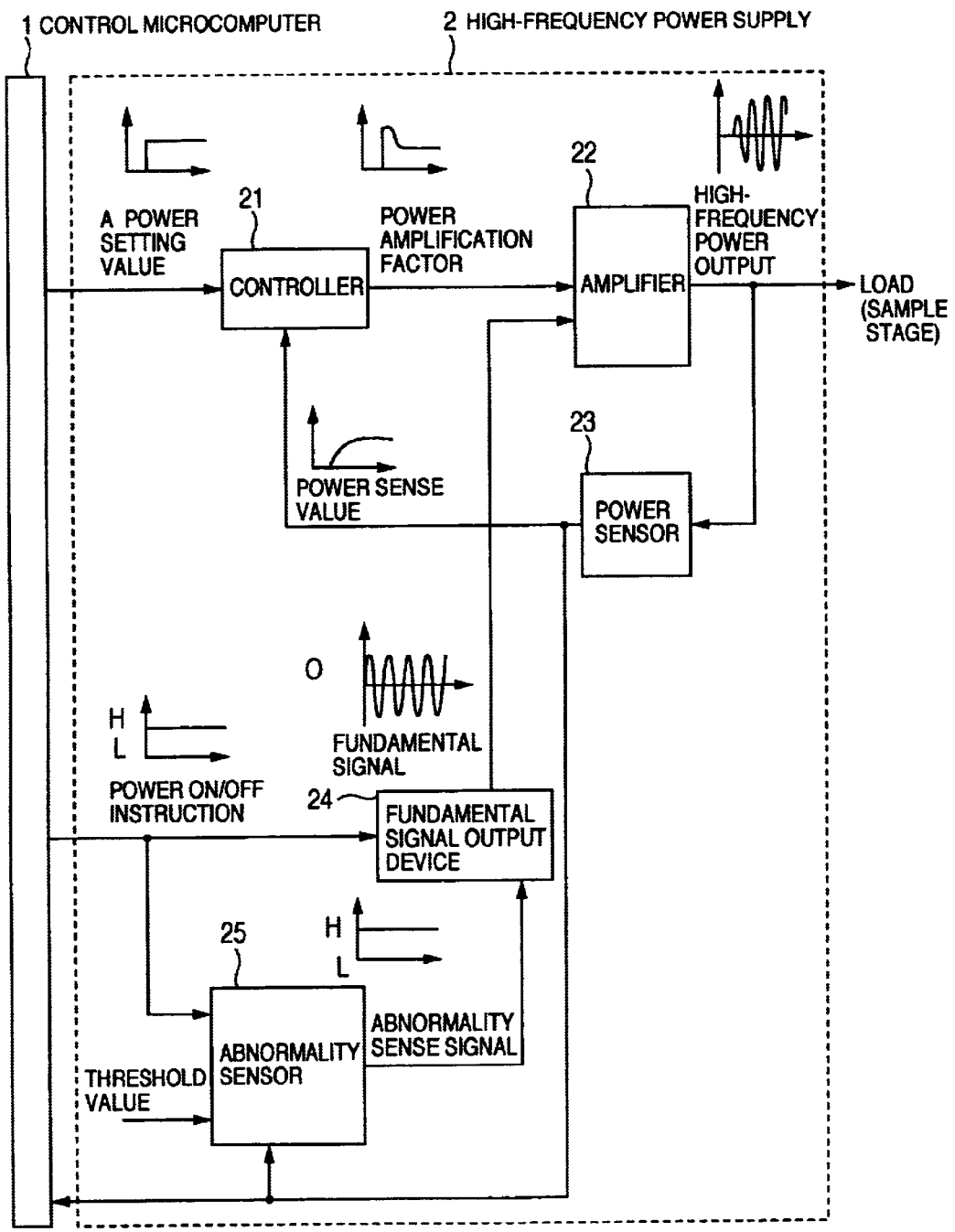
FIG. 1 is a control block diagram showing a first embodiment of high-frequency power supply according to the present invention.

Description will now be given of a first embodiment of the present invention by referring to the drawings. FIG. 1 shows an embodiment of the present invention. In FIG. 1, the embodiment includes high-frequency power supply 2 for a semiconductor making apparatus. The power supply 2 includes a controller 21, an amplifier 22, a power sensor 23, a fundamental signal output device 24, and an abnormality sensor 25. The power sensor 23 senses strength of power produced from the power supply 2 and outputs a power sense signal according to the strength. The abnormality sensor 25 receives a power on/off instruction to instruct whether or not power is to be outputted, the power sense signal, and a predetermined threshold value, determines whether or not an abnormal offset occurs in the power sense value, and outputs an abnormality sense signal indicating a result of the determination. The fundamental signal output device 24 receives the power on/off instruction and the abnormality sense signal to output a fundamental signal. The controller 21 outputs a power amplification factor according to difference between the power sense value and a power setting value as a setting value of strength of the output power. The amplifier 22 amplifies the fundamental signal according to the power amplification factor to output high-frequency power. In FIG. 1, examples of waveforms are shown between the constituent components in which an abscissa represents time.

Operation of the embodiment will be described. The microcomputer 1 of the semiconductor making apparatus outputs a power on/off instruction and a power setting value to the high-frequency power supply. The power on/off instruction indicates, for example, "power on" when the signal is at "a high level (H)" and "power off" when the signal is at "a low level (L)". For the power setting value, a range of the dc signal voltage from 0 volt (V) to 10 V may be set for the power ranging from 0 watt (W) to maximum output power of the power supply. In the power supply 2, the power sensor 23 includes a power directional coupler and a circuit to process a signal of a sense voltage thereof and outputs a power sense value, for example, as a dc signal voltage according to actual high-frequency power. The present invention is not restricted by the above configuration. It is possible to use a configuration which senses strength of the power to produce a power sense signal according to the sensed value. The microcomputer 1 monitors the power sense value and determines an abnormality when the value is beyond an allowed range set for the power setting value. The microcomputer 1 then stops processing of subsequent semiconductor wafers and, for example, notifies the condition to the operator. The signal of the power sense value to the microcomputer 1 can be processed as follows. For the power sense signal sensed by the power sensor 23 ranging, for example, from 0 W to a maximum output power value of the power supply 2, a range from 0 V to 10 V can be set for the dc signal voltage. The operation will be further described in detail.

Figure 2:
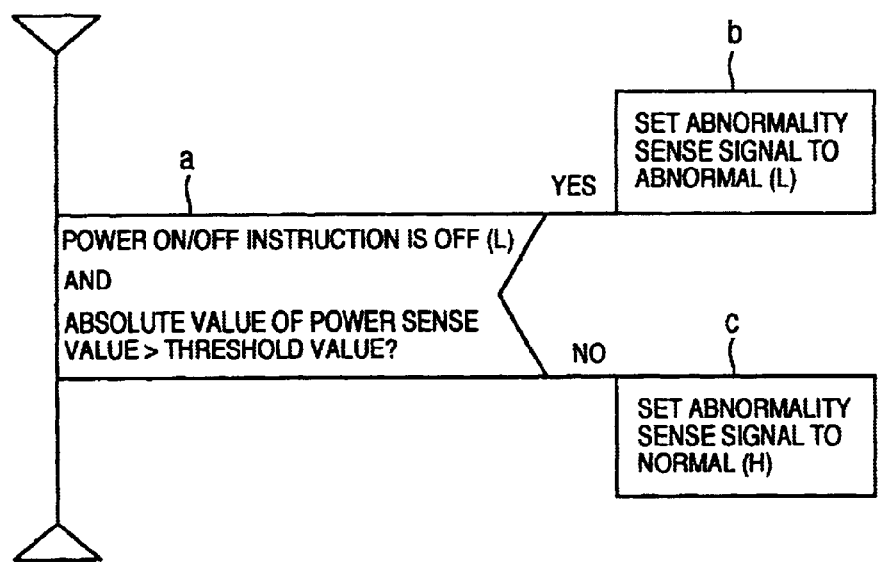
FIG. 2 is a functional diagram showing an abnormality sensor of FIG. 1.

Referring to FIG. 2, description will be given of part of processing, namely, steps a to c of the abnormality sensor 25.

Step a: Determines whether or not "the power on/off instruction indicates "off (L)" and an absolute value of the power sense value is larger than the threshold value.

Step b: When "yes" results, the abnormality sensor 25 determines an abnormality and sets the abnormality sense signal to "abnormal (L)".

Step c: When "no" results, the abnormality sensor 25 determines a normal state and sets the abnormality sense signal to "normal (H)".

This function may be implemented by an electronic circuit or software.

Figure 3:
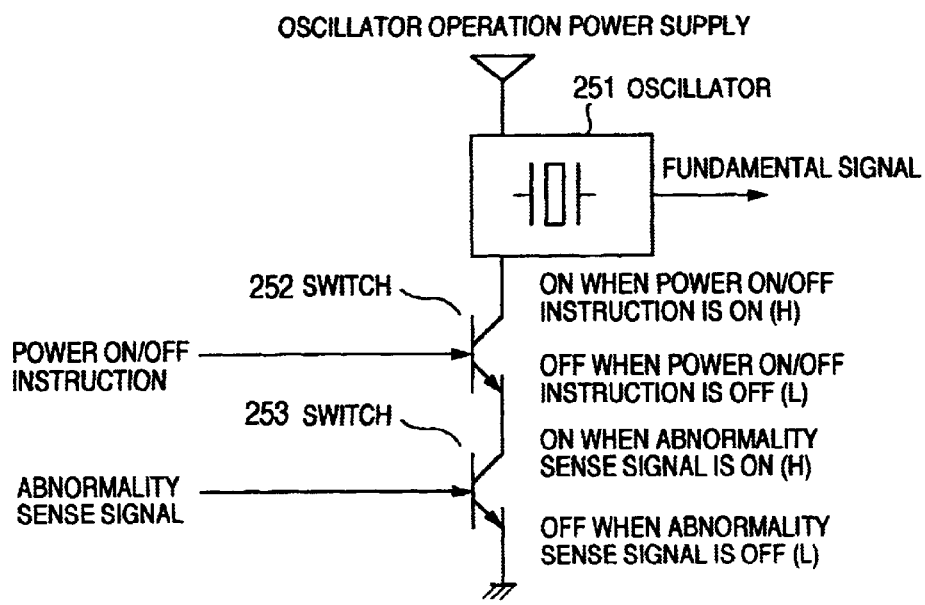
FIG. 3 is a functional diagram showing a fundamental signal output device of FIG. 1.

The fundamental signal output device 24 will be described by referring to FIG. 3. The device 24 includes an oscillator circuit 251 fixed to a fundamental frequency of the high-frequency power supply 2, a switch 252 and a switch 253 connected in series on a power supply line of operation power supply of the oscillator circuit 251. The fundamental frequency inherent to each power supply is, for example, as follows, namely, 450 megaherz (MHz) for plasma source power supply and 400 kiloherz (KHz), 800 KHz, 2 MHz, and 13.56 MHz for wafer bias power supply. An oscillator circuit of these frequencies includes, for example, a crystal oscillator. The switch 252 is set to an on state when an power on/off instruction sent from the microcomputer 1 is "on (H)" and is set to an off state when the instruction is "off (L)". The switch 253 is set to an on state when an abnormality sense signal from the abnormality sensor 25 is "normal (H)" and is set to an off state when the signal is "off (L)". Therefore, only when the power on/off instruction is "on" and the abnormality sense signal is "normal", the fundamental signal output device 24 outputs a signal of the fundamental frequency as a fundamental signal. In other states, the device 24 outputs a signal at a zero level as a fundamental signal.

The controller 21 outputs a power amplification factor according to difference between the power sense value from the power sensor 23 and the power setting value from the microcomputer 1. There is achieved, for example, so-called proportional integral (PI) control. First, a first signal is obtained by multiplying a proportional (P) gain by the difference between the power sense value and the power setting value. Next, the difference is integrated and a result of the integration is multiplied by an integration (I) gain to obtain a second signal. The first signal is added to the second signal, and a result of the addition is outputted as a power amplification factor.

The amplifier 22 amplifies, according to the amplification factor from the controller 21, a fundamental signal from the fundamental signal output device 24 to produce high-frequency power.

As described above, only when the power on/off instruction is "on" and the abnormality sense signal is "normal", the embodiment of the high-frequency power supply 2 conducts closed-loop control to output high-frequency power according to the power setting value. It can be therefore understood that this is a control operation using a logical product (AND) logic.

On the other hand, when the power on/off instruction is "off", the fundamental signal output device 24 outputs a fundamental signal at a zero level, and hence the actual high-frequency power and the power sense value are also at a zero level.

However, when an unexpected offset appears due to aging of analog parts and/or a latch-up phenomenon of digital parts of the power sensor 23, the power sensor 23 outputs a power sense value shifted by the offset.

Even when an offset occurs in the power sensor 23, the high-frequency power supply 2 of the embodiment sends the power sense value to the abnormality sensor 25 to monitor, when the power on/off instruction is "off", whether or not the absolute value of the power sense value exceeds the threshold value. Therefore, when the threshold value is exceeded, it is possible to detect an abnormality.

When the abnormality sense signal from the abnormality sensor 25 is "abnormal (L)", the fundamental signal output device 24 outputs a fundamental signal at a zero level, and hence the actual output power is forcibly set to zero. Therefore, the power sense value is clearly different from the power setting value, and hence even the microcomputer 1 monitoring these values can detect the abnormality.

If the system has a function to hold "abnormality" once the abnormality sense signal from the abnormality sensor 25 becomes "abnormal (L)", even when an offset exceeding a predetermined threshold value occurs, the output of power can be inhibited thereafter. This increases safety of the semiconductor wafers to be produced. When the microcomputer 1 receives the abnormality sense signal of FIG. 1 to monitor the signal, an abnormality can be directly detected. The function of the abnormality sensor 25 shown in FIG. 2 can be implemented by software of the microcomputer 1. When the abnormality sensor 25 is implemented by hardware other than the microcomputer 1 and the high-frequency power supply 4 of the prior art and is additionally disposed between the microcomputer 1 and the high-frequency power supply 4, the present invention can be implemented without changing the microcomputer 1 and the high-frequency power supply 4 or with few modifications thereof.

The threshold value used by the abnormality sensor 25 may be fixed to a value less than the offset allowable in the process. However, it is possible to conduct flexible operation in which the threshold value is set as a variable to be externally changed according to necessity of the semiconductor wafer process or the system management so that the offset allowed range is variable.

If the system is implemented such that when an offset abnormality occurs as above, the abnormality is notified by a display arranged in the high-frequency power supply 2 and by a display of an operator's console of a semiconductor making apparatus using the high-frequency power supply 2, the operator can more clearly recognize the abnormality in detail. The operator favorably records information such as a lot number and a wafer number of a wafer on which abnormal processing has been probably conducted.

In a semiconductor making apparatus, a semiconductor wafer is transported into a processing chamber and is removed from the chamber for each processing of the semiconductor wafer. Therefore, the power on/off instruction of the high-frequency power supply 2 is set to "off" during an interval between the wafer processing. Consequently, even if an offset abnormality occurs in the wafer processing, the abnormality can be detected when the power on/off instruction is set to "off" thereafter. If the semiconductor making apparatus has a step to stop the wafer processing for a subsequent wafer after the offset abnormality is detected, only one wafer is possibly defective in the entire processing.

Description has been given of an embodiment of power supply and a semiconductor making apparatus and a semiconductor wafer fabricating method using the same in which an abnormality can be detected even when an offset occurs in the power sensor 23. However, by inputting an output signal from a constituent component of the closed loop control system, for example, the controller 21 or the amplifier 22 to the abnormality sensor 25 or an abnormality sensor similar to the sensor 25 and by setting a predetermined threshold value thereto, even if an offset occurs in any part of the closed-loop control system of the high-frequency power supply due to an abnormality and/or aging thereof, an abnormality can be detected at an early point of time at a low cost without disposing additional devices to monitor input and output signals of the parts and without executing majority logic processing by using a multiple configuration of parts.

Figure 4:
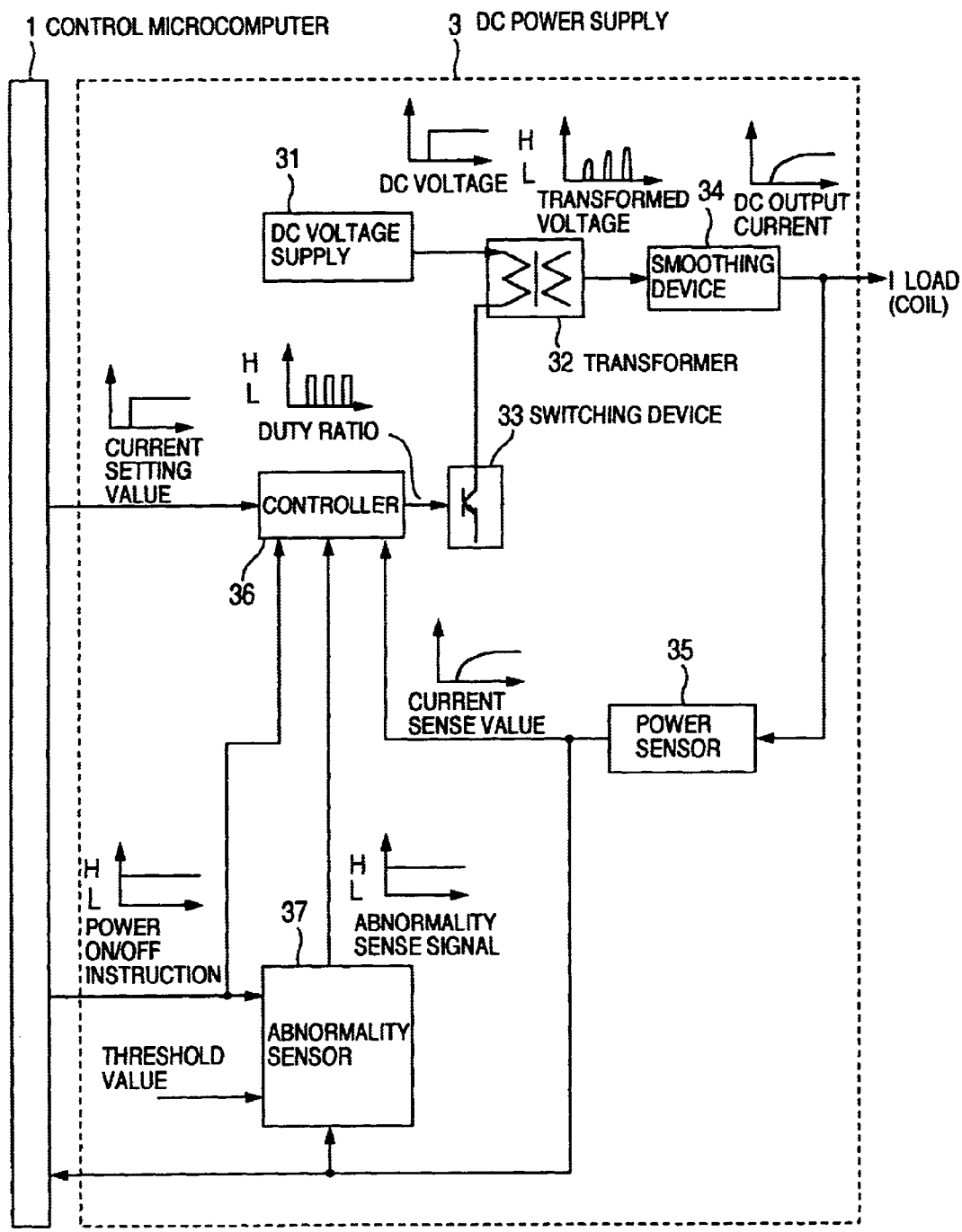
FIG. 4 is a control block diagram showing a second embodiment of dc power supply according to the present invention.

Description will now be given of a second embodiment of the present invention by referring to the drawings. In FIG. 4, dc power supply 3 for a semiconductor making apparatus outputs a dc current such that a coil as a load generates a desired magnetic field. The dc power supply includes a dc voltage device 31, a voltage transformer 32, a switching device 33, a smoothing device 34, a current sensor 35, a controller 36, and an abnormality sensor 37. The current sensor 35 senses strength of a current outputted from the dc power supply to output a current sense signal according to the strength. The abnormality sensor 37 receives a power on/off instruction to instruct whether or not a current is to be outputted, the current sense signal, and a predetermined threshold value, determines whether or not an abnormal offset occurs in the current sense value, and outputs an abnormality sense signal indicating a result of the determination. The controller 36 outputs a duty ratio according to the power on/off instruction, the abnormality sense signal, and a current setting value as a setting value of strength of the output current. The switching device 33 conducts on-and-off operation according to the duty ratio from the controller 36. The dc voltage device 31 produces a predetermined dc voltage. The transformer 32 transforms an input voltage on a primary side to output a transformed voltage from a secondary side. The smoothing device 34 smoothes the transformed voltage into a dc voltage. The dc power supply 3 divides the dc voltage by a resistance value of the load to obtain a dc current and outputs the dc current. In FIG. 4, examples of waveforms are shown between the constituent components of the power supply 3 in which an abscissa represents time.

Next, Operation of the embodiment will be described. The microcomputer 1 of the semiconductor making apparatus outputs a power on/off instruction and a current setting value to the dc power supply. The power on/off instruction indicates, for example, "power on" when the signal is at "a high level (H)" and "power off" when the signal is at "a low level (L)". For the current setting value, a range of the dc signal voltage from 0 V to 10 V can be set for the power ranging from 0 W to maximum output power of the power supply. The current sensor 35 of the power supply 3 includes constituent components such as a shunt resistor connected in series to a dc current output line and a circuit which divides a voltage between both ends of the shunt resistor by a resistance value of the shunt resistor to produce a sense signal, i.e., a current sense value according to strength of the dc current. Alternatively, the current sensor 35 includes constituent components such as a current sensing device using a Hall element and a circuit to process a signal of a sense voltage from the sensing device. The current sensor 35 in this case outputs a current sense signal according to an actual output current as, for example, a dc voltage. The present invention is not restricted by the above configuration. It is possible to use a configuration which senses strength of the power to produce a power sense signal according to the sensed value. The microcomputer 1 monitors the current sense value and determines an abnormality when the value is beyond an allowed range set for the current setting value. The microcomputer 1 then stops processing of subsequent semiconductor wafers and, for example, notifies the condition to the operator. The signal of the current sense value to the microcomputer 1 can be processed as follows. For the current sense signal sensed by the current sensor 35 ranging, for example, from 0 A to a maximum output current value of the power supply 3, a range from 0 V to 10 V can be set for the dc signal voltage. Next, the operation will be described in detail.

The abnormality sensor 37 is almost the same as the abnormality sensor 25 of the power supply 2 described in conjunction with the first embodiment. In FIG. 4, only "power sense value" of flow a in the abnormality sensing flowchart shown in FIG. 2 is replaced with "current sense value", and hence description of the abnormality sensor 37 will be avoided.

By referring to FIG. 5, description will be given of part of processing, namely, steps A to E of the controller 36.

Step A: Determines whether or not "the abnormality sense signal is normal (H) and the power on/off instruction indicates "on (H)".

Step B: When "yes" results, the controller 36 determines whether or not "absolute value of the current sense value>current setting value".

Step C: When "yes" results in step B, the controller 36 indicates to reduce the duty ratio.

Step D: When "no" results in step B, the controller 36 indicates to increase the duty ratio.

Step E: When "no" results in step A, the controller 36 indicates to output "0" as the duty ratio (the switching device 33 is kept in the off state).

The above function may be implemented by an electronic circuit or software.

The dc voltage device 31 of FIG. 4 outputs a predetermined dc voltage. The voltage transforming device 32 is, for example, a transformer including an input port on a primary side connected to an output from the dc voltage device 31 and an output port connected to the switching device 33. Therefore, when switching device 33 turns on and off according to the duty ratio, the transformer 32 outputs from the secondary side a signal with a waveform by chopping a predetermined dc voltage. A smoothing device 34 smoothes the transformed voltage from the transformer 32. A dc voltage resultant from the smoothing is divided by a resistance value of the load. A current thus obtained flows through the coil as the load.

As described above, when the abnormality sense signal is "normal (H)" and the power on/off instruction is "on (H)", the high-frequency power supply 3 of the embodiment conducts closed-loop control for the duty ratio of the switching device 33 to output a dc current according to the current setting value. On the other hand, when the power on/off instruction is "off", the duty ratio is zero (off; constant). Therefore, the switching device 33 keeps the off state, and hence the dc output current and the current sense value are at a zero level.

However, when an unexpected offset occurs due to aging of analog parts and/or a latch-up phenomenon of digital parts of the current sensor 35, the current sensor 35 outputs a current sense value shifted by the offset.

Even when an offset occurs in the current sensor 33, the dc power supply 3 of the embodiment delivers the current sense value to the abnormality sensor 37 to monitor, when the power on/off instruction is "off", whether or not the absolute value of the current sense value exceeds the threshold value. Therefore, when the threshold value is exceeded, it is possible to detect an abnormality.

Figure 5:
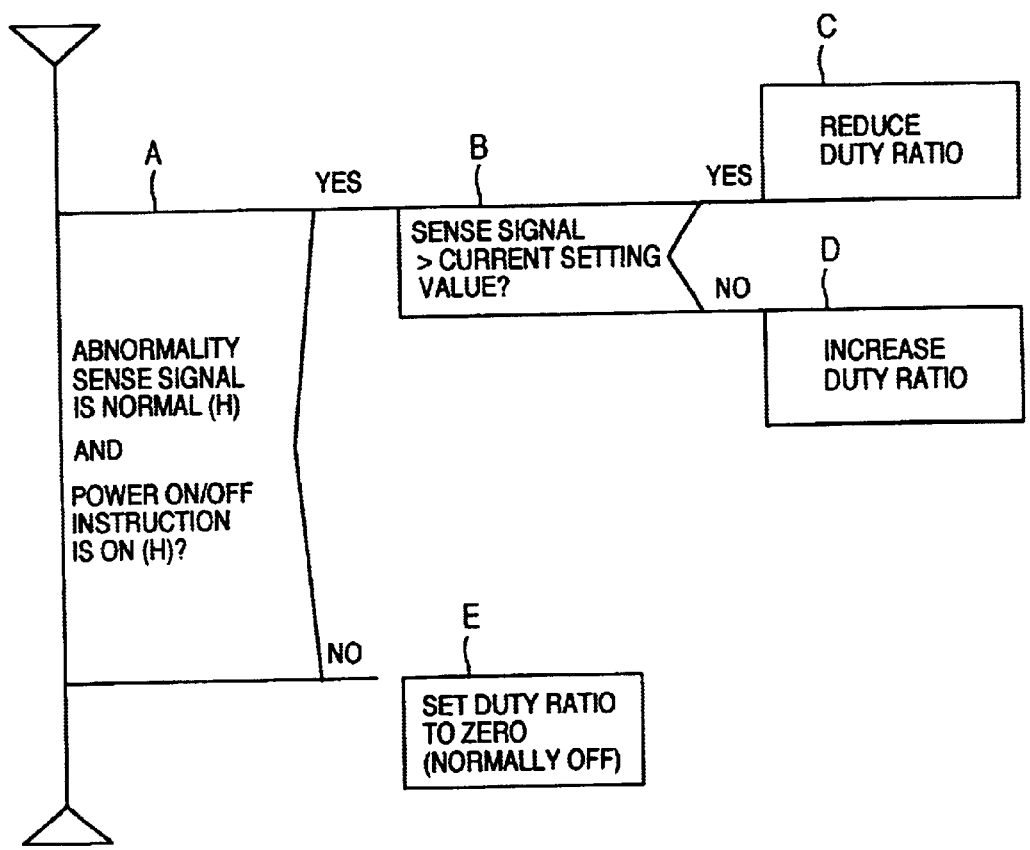
FIG. 5 is a functional diagram showing a controller of FIG. 4.
Figure 6:
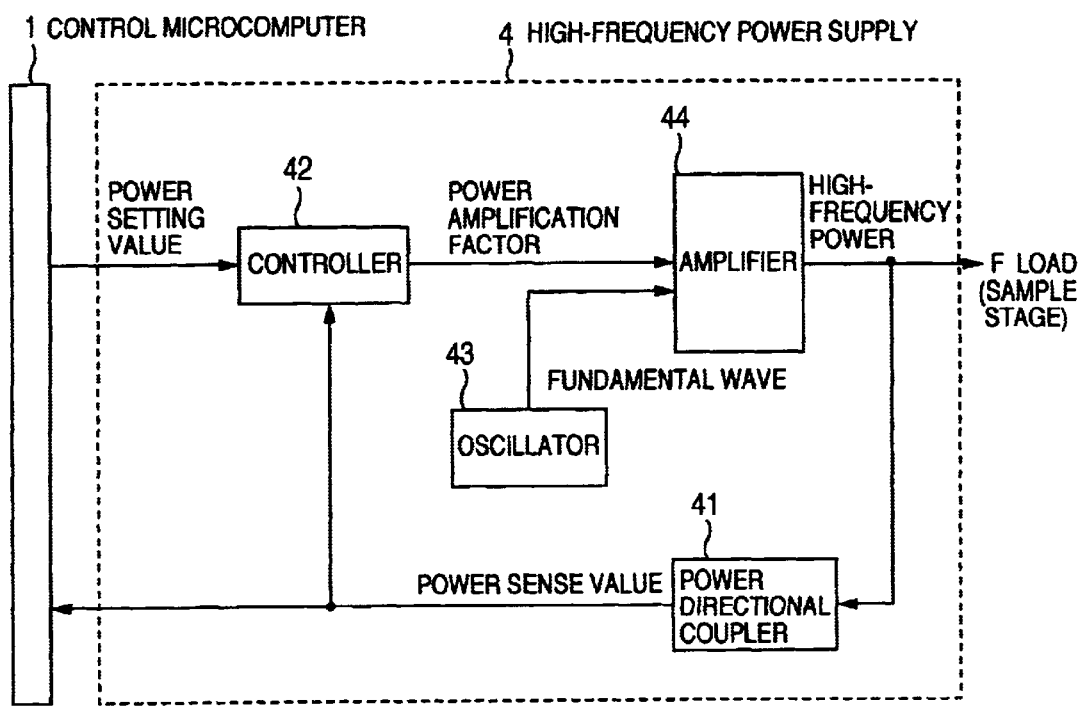
FIG. 6 is a control block diagram showing high-frequency power supply for a semiconductor making apparatus of the prior art.
Figure 7:
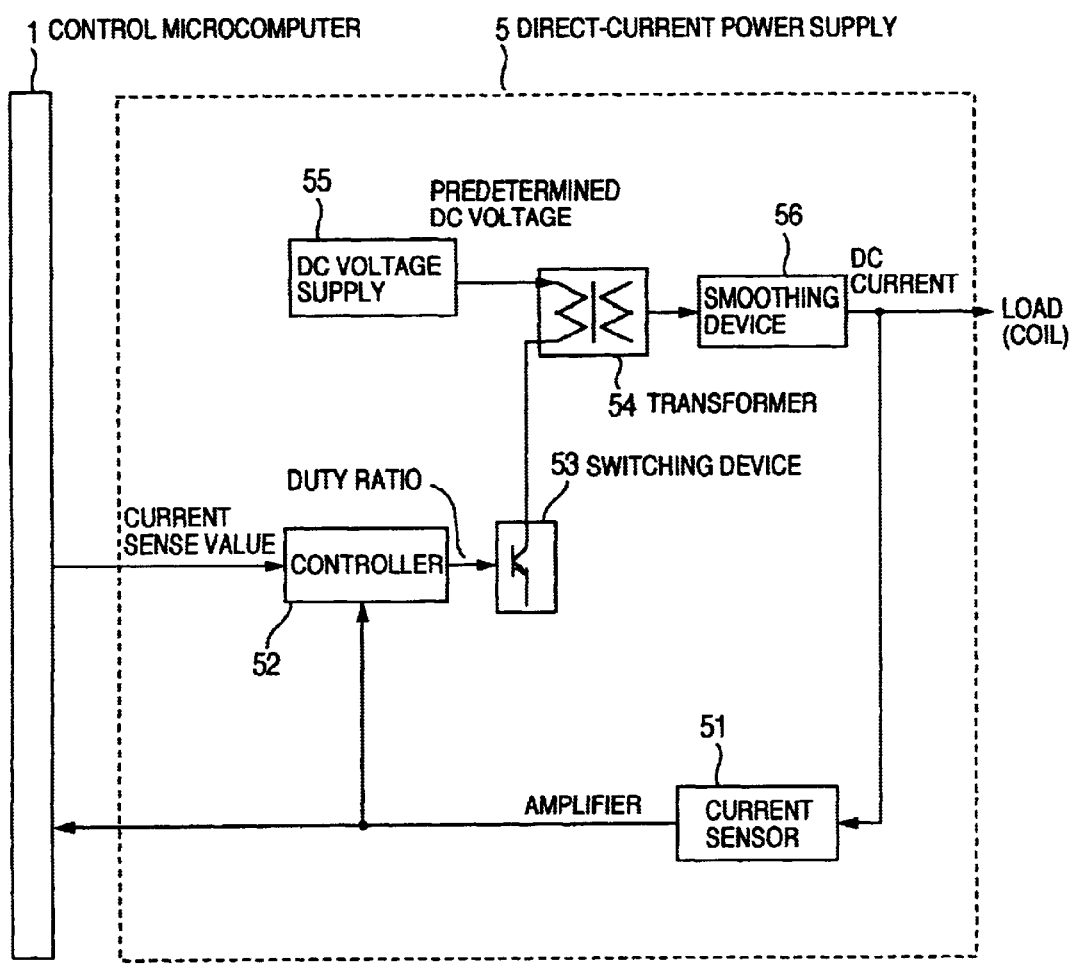
FIG. 7 is a control block diagram showing dc power supply for a semiconductor making apparatus of the prior art.

When the abnormality sense signal from the abnormality sensor 37 is "abnormal (L)", the controller 36 outputs "0" as the duty ratio according to FIG. 5. Therefore, the actual output power is forcibly set to zero. Resultantly, the current sense value is explicitly different from the current setting value, and hence even the microcomputer 1 monitoring these values can detect the abnormality.

If the system has a function to hold "abnormality" once the abnormality sense signal from the abnormality sensor 37 becomes "abnormal (L)", even when an offset exceeding a predetermined threshold value occurs, the output of power can be inhibited thereafter. This increases safety of the semiconductor wafers to be produced. When the microcomputer 1 receives the abnormality sense signal of FIG. 4 to monitor the signal, an abnormality can be directly detected. The function of the abnormality sensor 37 shown in FIG. 4 can be implemented by software of the microcomputer 1. When the abnormality sensor 37 is implemented by hardware other than the microcomputer 1 and the dc power supply 5 of the prior art and is additionally disposed between the microcomputer 1 and the dc power supply 5, the present invention can be implemented without changing the microcomputer 1 and the dc power supply 5 or with few modifications thereof.

The threshold value used by the abnormality sensor 37 may be fixed to a value less than the offset allowed in the process. However, it is possible to conduct flexible operation in which the threshold value is set as a variable to be externally changed according to necessity of the wafer process or the system management so that the offset allowed range is variable.

If the system is implemented such that when an offset abnormality occurs as above, the abnormality is notified by a display arranged in the dc power supply 3 and by a display of an operator's console of a semiconductor making apparatus using the dc power supply 3, the operator can more clearly recognize the abnormality in detail. The operator favorably records information such as a lot number and a wafer number of a wafer on which abnormal processing has been probably conducted.

In a semiconductor making apparatus, a semiconductor wafer is transported into a processing chamber and is removed from the chamber for each processing of the semiconductor wafer. Therefore, the power on/off instruction of the dc power supply 3 is set to "off" during an interval between the wafer processing. Consequently, even if an offset abnormality occurs in the wafer processing, the abnormality can be detected when the power on/off instruction is set to "off" thereafter. If the semiconductor making apparatus has a step to stop the wafer processing for a subsequent wafer after the offset abnormality is detected, only one wafer is possibly defective in the entire processing.

Description has been given of an embodiment of power supply and a semiconductor making apparatus and a semiconductor wafer fabricating method using the same in which an abnormality can be detected even when an offset occurs in the current sensor 35. However, by inputting an output signal from a constituent component of the closed-loop control system, for example, the switching device 33, the transformer 32, the smoothing device, or the controller 21 to the abnormality sensor 37 or an abnormality sensor similar to the sensor 25 and by setting a predetermined threshold value thereto, even if an offset occurs in any part of the closed-loop control system of the dc power supply 3 due to an abnormality and/or aging thereof, an abnormality can be detected at an early point of time at a low cost without disposing additional devices to monitor input and output signals of the parts and without executing majority logic processing by using a multiple configuration of parts.

In the embodiment, an output current is controlled as an example of control operation. However, assume dc power supply to output a dc output voltage by using a voltage sensor in place of the current sensor 35 of FIG. 4, a voltage divider circuit disposed, for example, between the output line and the ground, and a device which processes a signal of a voltage sensed by the voltage sensor to output a voltage sense value as a result of the processing. The present invention can be similarly applied to the dc power supply.

According to the present invention described above, there are provided power supply and a semiconductor making apparatus and a semiconductor fabricating method using the same in which when an offset occurs in a part constituting a closed-loop system of high-frequency power supply or dc power supply (to be simply referred to as power supply hereinbelow) for a semiconductor making apparatus, an abnormality is detected and the processing of subsequent semiconductor wafers can be stopped.

It should be further understood by those skilled in the art that the foregoing description has been made on embodiments of the invention and that various changes and modifications may be made in the invention without departing from the spirit of the invention and the scope of the appended claims.

What is claimed is:

1. Power supply for receiving a power value setting signal setting strength of power from said power supply and a power on/off instruction to set on or off of the power to produce the power supply power, wherein
   in response to detection of a state in which a power sense signal according to a value obtained by sensing the strength of the power exceeds a predetermined value when said power on/off instruction is off, the power supply power is suppressed regardless of a state in which the power on/off instruction is set to on.

2. Power supply according to claim 1, wherein:
   the power is under closed-loop control using the power sense signal; and
   when the power sense signal exceeds a predetermined threshold value, either one of the signals used for the closed-loop control is set to a zero level to thereby suppress the power.

3. Power supply according to claim 1, comprising abnormality sensing means for assuming an abnormality if the power sense signal exceeds a predetermined threshold value when the power on/off instruction is off to provide an abnormality sense signal.

4. Power supply according to claim 1, comprising means for displaying an abnormality indication in response to occurrence of an event in which the power sense signal exceeds a predetermined threshold value when the power on/off instruction is off, to provide an abnormality sense signal.

5. A semiconductor making apparatus, comprising:
   a processing chamber for processing a semiconductor wafer;
   a power supply for providing a current, a voltage, or power as an output item necessary for the semiconductor wafer processing;
   a control microcomputer for setting a strength of the output item to said power supply and setting the outputting of the output item; and
   output sensing means for sensing the output item to provide an output sense signal according to a value obtained by sensing the output item, wherein
   if the output sense signal exceeds a predetermined threshold value when the outputting of the output item is off, the processing for a subsequent semiconductor wafer to be processed is stopped.

6. A semiconductor making apparatus, comprising:

a processing chamber for processing a semiconductor wafer;

a power supply for supplying a current, a voltage, or power as an output item necessary for the semiconductor wafer processing;

a control microcomputer for setting strength of the output item to said power supply and setting the outputting of the output item to on or off;

sensing means for sensing the output item and outputting an output sense signal according to a value obtained by sensing the output item; and abnormality display means for displaying an abnormality indication in response to an event in which the output sense signal exceeds a predetermined threshold value when the outputting of the output item is off, the processing is stopped for a subsequent semiconductor wafer to be processed.

7. A semiconductor making apparatus, comprising:

a processing chamber for processing a semiconductor wafer;

a power supply for supplying a current, a voltage, or power as an output item necessary for the semiconductor wafer processing;

a control computer for setting a strength of the output item to said power supply and setting the outputting of the output item to on or off;

output sensing means for sensing the output item to provide an output sense signal according to a value obtained by sensing the output item;

means for generating an abnormality occurrence signal in response to an event in which the output sense signal exceeds a predetermined threshold value when the outputting of the output item is off; and means connected to said generating means for interrupting the supply of the output item from said power supply to thereby inhibit, according to the abnormality occurrence signal, the processing for a subsequent semiconductor wafer to be processed.

8. A semiconductor making apparatus according to claim 7, further comprising abnormality display means for displaying, in response to the abnormality occurrence signal from said abnormality occurrence signal generating means, an abnormality indication on a screen of an operator's console or an alarm display of said semiconductor making apparatus.

* * * * *